United States Patent [19]

Ng et al.

[11] Patent Number: 4,600,669
[45] Date of Patent: Jul. 15, 1986

[54] ELECTROPHOTOGRAPHIC COLOR PROOFING ELEMENT AND METHOD FOR USING THE SAME

[75] Inventors: Yee S. Ng, Fairport; Lawrence E. Contois; John D. Mitchell, both of Webster; James D. Walling, Fairport, all of N.Y.

[73] Assignee: Eastman Kodak Company, Rochester, N.Y.

[21] Appl. No.: 773,528

[22] Filed: Sep. 6, 1985

Related U.S. Application Data

[62] Division of Ser. No. 686,509, Dec. 26, 1984, abandoned.

[51] Int. Cl.4 .......................................... G03G 13/01
[52] U.S. Cl. ...................................... 430/47; 430/42; 430/46; 430/124; 430/126; 430/293; 430/358
[58] Field of Search ................. 430/46, 47, 124, 126, 430/143, 293, 358, 366, 42

[56] References Cited

U.S. PATENT DOCUMENTS

| | | | |
|---|---|---|---|
| 3,549,447 | 12/1970 | Bresnick | 430/126 X |
| 3,615,387 | 10/1971 | Corrsin et al. | 430/67 X |
| 3,798,029 | 3/1974 | Saklikar | 430/67 |
| 3,833,293 | 9/1974 | Serio et al. | 430/47 |
| 3,856,548 | 12/1974 | Taylor et al. | 430/66 X |
| 3,871,879 | 3/1975 | Arai | 430/47 |
| 4,002,794 | 1/1977 | Schwarcz | 428/40 X |
| 4,066,802 | 1/1978 | Clemens | 430/47 |
| 4,234,643 | 11/1980 | Grotefend et al. | 428/207 X |
| 4,337,303 | 6/1982 | Sahyun et al. | 430/126 X |
| 4,350,748 | 9/1982 | Lind | 430/49 |
| 4,358,195 | 11/1982 | Kuehnle et al. | 355/4 |
| 4,425,417 | 1/1984 | Ingalls et al. | 430/30 |

FOREIGN PATENT DOCUMENTS

| | | | |
|---|---|---|---|
| 637014 | 2/1962 | Canada | 430/126 |
| 44-28037 | 11/1969 | Japan | 430/66 |
| 1016472 | 1/1966 | United Kingdom | 430/124 |
| 1035837 | 7/1966 | United Kingdom | |

*Primary Examiner*—Roland E. Martin
*Attorney, Agent, or Firm*—David F. Janci

[57] ABSTRACT

An electrophotographic proofing element is described comprising a photoconductive layer on an electrically conducting substrate, capable of transmitting actinic radiation to which the photoconductive layer is responsive, and a dielectric support, releasably adhered to the substrate, comprising the photoconductive layer or an overcoat thereof forming a surface of the element capable of holding an applied electrostatic charge. To use the element, the surface of the dielectric support is charged, and the photoconductive layer is imagewise-exposed to actinic radiation, thereby forming a developable electrostatic image on the dielectric surface. The electrostatic image, in turn, is developed with toner to form a first color image. A composite color image is formed on the element by repeating the sequence one or more times with imagewise exposure of the photoconductive layer to actinic radiation transmitted through the transparent support, and developing over each preceding image with a different color toner. The composite toner image is transferred with the dielectric support to a receiving element to form a color copy such as a three-color filter array or a color proof closely simulating the color print expected from a full press run.

11 Claims, 9 Drawing Figures

ELECTROPHOTOGRAPHIC COLOR PROOFING ELEMENT AND METHOD FOR USING THE SAME

This is a division of application Ser. No. 686,509 filed Dec. 26, 1984, now abandoned.

The present invention relates to an electrophotographic proofing element adapted to form a multicolor toner image. In particular, the invention relates to an electrophotographic element containing a dielectric support releasably adhered to a photoconductive element adapted to form two or more color toner images.

Color proofing is employed in the color printing field to form representative interim prints from color separation components in the form of screened or unscreened separation negative or positive films or masks. Through the formation of such proofs, the separation components can be evaluated prior to the manufacture of expensive printing plates with such components to determine whether the separation components faithfully duplicate their contribution to the desired finished product, and whether the color separations formed from the separation components are in proper register. If so, the printing plate associated with each separation component is prepared and ultimately employed in the press run. As is often the case, however, the separation component requires repeated alteration to satisfy the user, an expensive proposition if new printing plates are prepared after each such alteration. Instead, inexpensive proofs serve in this pre-press evaluation of the separation components.

A number of systems are employed in the color-proofing area and are described in detail in U.S. Pat. No. 4,425,417 issued Jan. 10, 1984. For example, in one system, presensitized sheets are exposed to light through a separation silver halide negative and developed to provide a color separation image on a transparent support. The resulting color separation images are then overlaid in register on a paper support to provide a proof.

U.S. Pat. No. 4,358,195 issued Nov. 9, 1982, describes an electrophotographic proofing element upon which color toner images are sequentially formed and transferred to an element in register with previously formed and transferred toner images. The system described in this patent thus avoids the use of presensitized materials. However, like other systems, the electrophotographic color proofing system described in U.S. '195 requires that the registration of each color separation image on the composite proofing element take place during each toner-transfer stage of the process. Unfortunately, registration of toner separation images at the toner transfer stage of the process is an inherently slow process. Furthermore, proper registration of the images is dependent on virtually absolute dimensional stability of the receiver element to which the images are transferred throughout all the transfer steps. It will be appreciated that it is difficult to prevent stretch or shrinkage or other distortion of the element while it is subjected to pressure, heat or liquid toner media during development or transfer. When distortion occurs, image registration suffers. In addition, the transfer of the toner images from the electrophotographic proofing element to the receiver as described in U.S. '195 can be incomplete, resulting in lower-quality image compared with the quality of an image achieved with substantially complete transfer of toner.

British Pat. No. 1,035,837, on the other hand, describes an electrophotographic overprinting method in which color toner separation images are formed in sequence and in overlapping configuration on a photoconductive element for simulating, as the patent points out, the hue, intensity, transparency and overprinting characteristics of standard lithographic four-color ink systems. To provide for overprinting of the separation images directly on the photoreceptor, the patent teaches the use of whitish, light-colored or transparent waxy substances with its disclosed toners so as to avoid the blanketing effect of pigments in the toner of previously formed images. It is apparent from this teaching that color quality is sacrificed for the sake of overprinting directly on the photoreceptor. Furthermore, the background against which the overprinted toners are viewed does not faithfully represent the print background against which lithographic inks are viewed after a press run.

In accordance with the invention, an electrophotographic proofing element is provided which can be employed in a color proofing method as described below to form toner colors truly representative of the press run colors desired. When employed in the color proofing method, this element provides for viewing of a composite toner image against a background which is—or closely resembles—the print stock in a press run. The proofing element provided by the present invention comprises:

(a) a photoconductive layer on an electrically conductive substrate capable of transmitting actinic radiation to which the photoconductive layer is responsive and (b) a releasable dielectric support comprising the photoconductive layer, or an overcoat thereof, forming a surface of the element capable of holding an applied electrostatic charge.

In the element so defined, the photoconductive layer is charged, imagewise-exposed to actinic radiation, and contacted with an electrographic developer to form a first toner color separation image on the dielectric support. The imagewise exposure in forming the first toner image can be from the front surface or it can be from the rear surface, in which case actinic radiation passes through the substrate. However, in the formation of subsequent toner separation images overlapping the first toner image on the dielectric support, imagewise exposure to actinic radiation is conducted through the radiation-transmissive, electrically conducting substrate. In this way, electrostatic images faithfully corresponding to the exposure pattern can be formed on the dielectric support despite the presence of toner images from previous imaging cycles.

Accordingly, in another embodiment of the present invention, a multicolor proofing method is provided employing the above-defined element. This method comprises:

(1) forming a first color separation image on the dielectric support of the electrophotographic proofing element by:

(a) overall charging the surface of the dielectric support, (b) imagewise-exposing the photoconductive layer to actinic radiation to form a first electrostatic image on the surface of the dielectric support, and (c) developing the first electrostatic image with a first color developer composition to form the first color separation image, (2) forming a second color separation image over the first color separation image on the dielectric support by:

(d) overall charging the surface of the dielectric support and first color separation image, (e) while the dielectric support and first color separation image are still charged, imagewise-exposing the photoconductive layer through the substrate to form a second electrostatic image on the surface of the dielectric support and first color separation image, and (f) developing the second electrostatic image with a second color developer composition to form the second color separation image, and (3) contacting the surface of the dielectric support having the color separation images thereon with a receiving element, and (4) transferring the dielectric support and color separation images to the receiving element to form a multicolor proof.

The present invention marks the first time that a releasable support is employed in combination with an actinic radiation-transmissive substrate in a color proofing element. The invention provides for convenient registration of all the separation images directly on the described element. In addition, substantially complete transfer of the overlapping color separation images is effected as a consequence of simultaneous transfer with the dielectric support, to produce thereby a high-quality color proof which faithfully resembles the printed product from an anticipated full press run. The transferred dielectric support also provides protection for the toner images sandwiched between the dielectric support and the receiver in the form of abrasion-resistance, and also color stability, particularly if the toner colorants are vulnerable to light or aerial degradation.

DESCRIPTION OF THE DRAWINGS

The invention will be described with reference to the drawings in which.

DETAILED DESCRIPTION OF THE PREFERRED EMBODIMENTS

Figure 1:
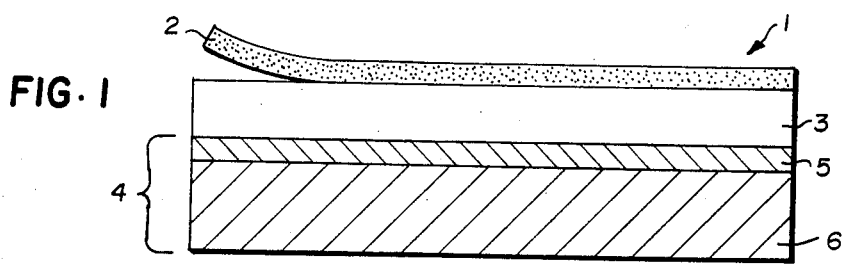
FIG. 1 illustrates an electrophotographic proofing element of the invention.

The present invention provides a unique electrophotographic proofing element adapted to form a plurality of at least partially overlapping toner color separation images directly on the proofing element. It differs from electrophotographic annotation in that toner from one imaging cycle may deposit on toner from prior imaging cycles, whereas in conventional annotation toner images are sequentially added usually only to untoned regions of the photoreceptor. To form such overlapping toner separation images directly on the electrophotographic element, it is necessary to provide means by which the photoconductive portion of the element can be imagewise-illuminated in such a manner as to form latent electrostatic images on untoned, as well as toned, regions of the photoreceptor. Furthermore, after each toner separation image is formed in overlapping configuration, means must be provided to view the composite image resulting from such overlapping images on the print stock (usually paper) upon which the multicolor press run prints will be made after approval of the color proof. The present invention provides for these objectives and other advantages through the use of an electrically conducting substrate capable of transmitting actinic radiation to which the photoconductive layer is responsive, and through the use of a releasable dielectric support forming a charge-holding surface of the element.

The electrophotographic proofing element of the present invention comprises a photoconductive layer on an electrically conducting substrate transmitting actinic radiation for the photoconductive layer, and a dielectric support releasably adhered to and forming a chargeable surface of the element. The dielectric support, as previously noted, comprises the photoconductive layer, in which case the element can comprise the photoconductive layer—functioning also as the dielectric support—releasably adhered to the electrically conducting substrate. Alternatively, the releasable dielectric support can comprise an overcoat on the photoconductive layer. The latter is preferred, and the discussion below is directed predominantly to the use of a such embodiment for purposes of illustrating the invention.

Any type of material can be employed as the photoconductive layer which is capable of charge carrier formation under the influence of electrostatic charging and exposure to actinic radiation. Inasmuch as the present element can be discarded after the formation of the proof, single-use photoconductive layers are preferably employed. Representative materials and layers include polyarylamines or arylalkane photoconductors as described, for example, in U.S. Pat. No. 4,442,193, the disclosure of which is incorporated herein by reference. The photoconductors described in U.S. '193 include:

(1) arylamines, diarylamines, nonpolymeric and polymeric triarylamines such as tri-p-tolylamine;

(2) polyarylalkanes such as triphenyl methanes and tetraphenyl methanes, for example, bis(4-diethylamino)-tetraphenyl methane;

(3) 4-diarylamino-substituted chalcones;

(4) nonionic cycloheptenyl compounds;

(5) compounds containing an:

=N—N=                                              1 nucleus;

(6) organic compounds having a 3,3'-bis-aryl-2-pyrazoline nucleus;

(7) triarylamines in which at least one of the aryl radicals is substituted by either a vinyl radical or a vinylene radical having at least one active hydrogen-containing group;

(8) triarylamines in which at least one of the aryl radicals is substituted by an active hydrogen-containing group;

(9) any other organic compound which exhibits photoconductive properties such as those set forth in U.S. Pat. No. 3,250,615 and Australian Pat. No. 248,402, and the various polymeric photoconductors such as the photoconductive carbazole polymers described in U.S. Pat. No. 3,421,891.

In preferred photoconductive compositions, arylalkane leuco base photoconductors are the principal photoconductive constituents. Such preferred compositions are advantageously nonpersistently conductive and sensitive to radiation below 400 nm, but substantially insensitive to radiation above 400 nm. Arylalkane leuco base photoconductors are disclosed, for example, in U.S. Pat. No. 3,542,547 above and bear the structure:

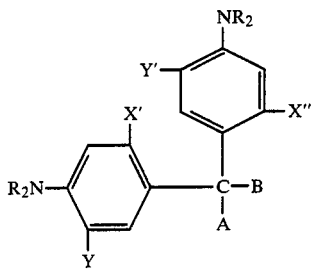

II wherein:

each of R and R' is selected from the group consisting of hydrogen, alkyl and aralkyl having 1-4 carbon atoms in the alkyl group;

each of X' and X" is selected from the group consisting of alkyl having 1 to 4 carbon atoms, alkoxy having 1-4 carbon atoms, hydroxyl and halogen;

each of Y' and Y" is selected from the group consisting of alkyl having 1-4 carbon atoms, alkoxy having 1-4 carbon atoms, hydroxyl, halogen and hydrogen; and each of A and B is:

(1) hydrogen, with the proviso that A and B are not both hydrogen;

(2) aryl such as phenyl, α-naphthyl, β-naphthyl, 9-anthryl and substituted derivatives thereof wherein the substituent is dialkylamino, alkylamino, amino, alkyl, alkoxy, hydroxyl or halogen;

(3) an aliphatic alkyl group having 1-18 carbon atoms, e.g., methyl, ethyl, propyl, butyl, isobutyl, octyl, dodecyl, etc., including a substituted alkyl group having 1-18 carbon atoms;

(4) a cycloalkyl group having 4-8 carbon atoms in the cyclic nucleus, e.g., cyclobutyl, cyclohexyl, cyclopentyl, etc., including a substituted cycloalkyl group; or (5) a cycloalkenyl group having 4-8 carbon atoms in the cyclic nucleus, e.g., cyclohex-3-enyl, cyclopent-3-enyl, cyclobut-2-enyl, cyclohex-2-enyl, etc., including a substituted cycloalkenyl group.

Representative Formula II arylmethane photoconductors are set forth in Table 2 of U.S. Pat. No. 3,542,547. Particularly useful photoconductive compositions comprise crystallization-inhibiting mixtures of two or more of the arylalkane leuco base photoconductors as disclosed in U.S. Pat. No. 4,301,226 issued Nov. 17, 1981, to L. E. Contois et al. A preferred crystallization-inhibiting mixture comprises three arylmethane photoconductors: bis(4-N,N-diethylamino-2-methylphenyl)-4-methylphenylmethane, 1,1-bis(4-N,N-diethylamino-2-methylphenyl)-2-methylpropane and 4,4'-bis(diethylamino)-2,2'-dimethyltriphenylmethane.

The total amount of photoconductor in the defined composition may vary widely, but preferably ranges from about 5 to about 40 weight percent based on the solvent-free weight of the layer.

Photoconductors described above can be incorporated into an electrically insulating binder and coated as photoconductive layers on a transparent electrically conductive support to form all or a portion of the electrophotographic proofing element of the invention, depending on whether the photoconductive layer is also the releasable dielectric support.

Preferred electrically insulating binders for use in preparing the photoconductive layers are film-forming, hydrophobic polymeric binders having fairly high dielectric strength. Materials of this type comprise styrene-butadiene copolymers; silicone resins; styrene-alkyd resins; silicone-alkyd resins; soya-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals) such as poly(vinyl butyral); polyacrylic and polymethacrylic esters such as poly(methyl methacrylate), poly(n-butyl methacrylate), poly(isobutyl methacrylate); polystyrene; nitrated polystyrene; polymethylstyrene; isobutylene polymers; polyesters such as poly[ethylene-co-alkylenebis(alkyleneoxyaryl)-phenylenedicarboxylate]; phenolformaldehyde resins; ketone resins; polyamides; polycarbonates; polythiocarbonates; poly(isopropylidene-bis-phenoxyethylene-co-terephthalate]); poly[ethylene-co-isopropylidene-2,2-bis(ethyleneoxyphenylene)terephthalate]; copolymers of vinyl haloarylates; poly(ethylene-co-neopentyl terephthalate); and vinyl acetate such as poly(vinyl-m-bromobenzoate-co-vinyl acetate).

Especially useful binders are polyesters having relatively high glass transition temperature (Tg) values and being able to accomodate high photoconductor concentrations without the photoconductors migrating from the photoconductive layer toward the dielectric support. If such migration occurs, photoconductive compounds, often undesirably colored, can ultimately pass to the receiving element when the support is transferred in the color proofing method described herein. Use of polymers with a relatively high Tg, moreover, prevents unwanted charge injection when the photoconductive layer is also the releasable dielectric support as discussed in greater detail below. Examples of such relatively high Tg polyesters are poly[(4,4'-norbornylidene)bisphenoxyethylene-co-ethylene terephthalate]; poly[(4,4'-hexahydro-4,7-methanoindene-5-ylidene)bisphenoxyethylene-co-ethylene terephthalate]; poly[(isopropylidene)bisphenoxyethylenecoethylene naphthoate]; poly(1,2-propylene naphthoate); poly[(isopropylidene)bisphenoxyethylene-co-1,2-propylene naphthoate]; poly[(4,4'-isopropylidene)- bisphenoxyethylene-co-bis(1,2-propylene)naphthoate]; and poly[1,2-propylene methylsuccinate-co-naphthoate].

The photoconductive layers employed in the above-defined element are preferably selected so as to provide sensitivity below 400 nm only and exhibit nonpersistent conductivity. (400 nm represents the approximate spectral wavelength of transition between visible and nonvisible light; persistent conductivity refers to the lingering conductivity of some materials in exposed regions.) Such sensitivity below 400 nm permits charging, exposure and development of the photoconductive composition in visible light.

Nonpersistent conductivity is important because the photoconductive layer is to be cycled through a charge-expose-develop sequence a number of times to produce a multicolor proof. If the photoconductive layer is persistent, that is, if the layer remains conductive in light-struck regions from preceding exposure steps, unwanted image formation from such preceding steps will contaminate subsequent images desired. Specifically, it is desirable that the period during which the photoconductive layer remains conductive after exposure to actinic radiation be less than 30 seconds.

To further enhance the photosensitivity of the photoconductive layer, sensitizers are preferably incorporated therein. These sensitizers are preferably sensitizers for the region of the electromagnetic spectrum below 400 nm exclusively to further provide roomlight handleability of the element during use. Particularly useful sensitizers providing such sensitivity are described in the above-mentioned U.S. Pat. No. 4,442,193. These sensitizers are 1,4,5,8-naphthalene dicarboximide compounds and are particularly useful as sensitizers for arylalkane leuco base photoconductors. The preferred structure of these compounds is:

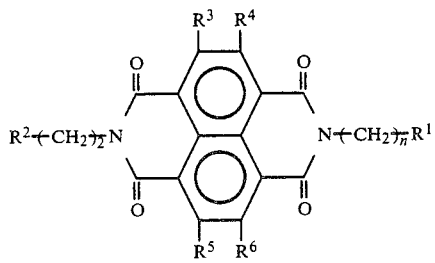

III wherein:

$R^1$ and $R^2$, which may be the same or different, represent aryl, such as phenyl or naphthyl, or aryl substituted with alkyl, alkoxy, perfluoroalkyl or perfluoroalkoxy groups having 2-20 alkyl carbon atoms; sulfonyl; sulfone; sulfonamide; nitrile; or nitro groups;

$R^3$, $R^4$, $R^5$ and $R^6$, which may be the same or different, represent hydrogen, alkyl having 1-4 carbon atoms, alkoxy having 1 to 4 carbon atoms, or halogen; and n is 0 to 3.

Preferably, $R^1$ and $R^2$ in Formula I are phenyl or phenyl substituted with alkyl, alkoxy or perfluoralkyl, and $R^3$, $R^4$, $R^5$ and $R^6$ are hydrogen.

Representative 1,4,5,8-naphthalene bis-dicarboximides employed in the photoconductive layer include N,N'-bis[p-(n-butyl)phenyl]-1,4,5,8-naphthalene bis-dicarboximide; N,N'-bis(m-trifluoromethylphenyl)-1,4,5,8-naphthalene bis-dicarboximide; N,N'-bis(3-phenylpropyl)-1,4,5,8-naphthalene bis-dicarboximide; N,N'-bis[p-(n-actyloxy)phenyl]-1,4,5,8-naphthalene bis-dicarboximide; N,N'-bis(phenyl)-1,4,5,8-naphthalene bisdicarboximide.

The amount of dicarboximide employed can vary widely in accordance with the degree of sensitization desired. Effective amounts of the sensitizer represented by Structure III can vary widely to provide sufficient speed to the photoconductive layer. The optimum concentration in any given case will vary with the specific photoconductor and sensitizing compound used. Substantial speeds can be obtained where a sensitizer according to Structure III is added in a concentration range from about 0.0001 to about 30 percent based on the weight of the composition on a dry basis. A preferred sensitizer concentration range is from about 0.005 to about 5.0 percent.

The thickness of the photoconductive layer can vary depending on the type of photoconductors employed in the layer, speeds desired and other factors. Photoconductive layer thicknesses in the range from about 2 to about 20 micrometers are useful, while layer thicknesses of from about 5 to about 13 micrometers are preferred.

As can be seen from the foregoing discussion, the photoconductive layer is often colored as a result of the photoconductive, as well as sensitizing, constituents in the layer. For this reason, it is preferred to use a separate overcoat on the photoconductive layer as the releasable dielectric support; otherwise, after transfer of the composite toner image to a receiver as discussed below, the resulting color proof may contain undesirable hue as a result of such consituents in the photoconductive layer if the latter is employed as the releasable dielectric support. It will be appreciated, however, that transparent and colorless photoconductive layers can be prepared for use in the element, in which case such minor difficulties would be overcome. Furthermore, the presence of any hue from the photoconductive layer may not be objectionable in some user applications.

In a preferred embodiment, a separate dielectric support, is releasably adhered to the photoconductive layer. To facilitate such releasability, the photoconductive layer can contain release addenda. Useful and preferred release addenda are block copolyesters of polysiloxanes corresponding to the structure:

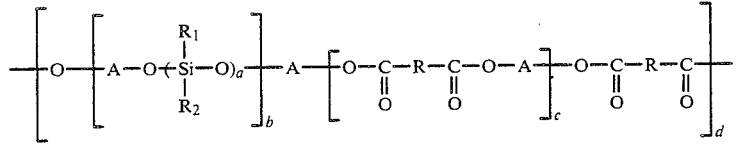

wherein:

R is an alkylene radical containing at least 3 carbon atoms;

$R^1$ is an alkyl radical and $R^2$ is an alkyl, alkaryl, aralkyl or aryl radical;

A is an alkylene or arylene radical;

a is an integer of at least 10;

b is an integer of at least 1;

c is an integer of at least 2; and d is an integer of at least 2;

as described in U.S. Pat. No. 3,861,915, the disclosure of which is incorporated herewith by reference. The release agents in U.S. '915 can be prepared by reacting dihalopolydiorganosiloxane with an aromatic or aliphatic diol to form the dihydroxypolydiorganosiloxane subsequently reacted with an aliphatic dicarboxylic acid halide to form the block copolyester shown.

Alternative release agents which can also be used are:

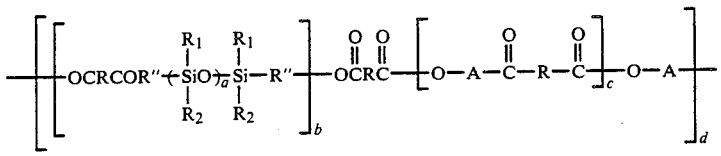

wherein:

a, b, c, d, R, $R^1$, $R^2$ and A are the same as described above and $R^{11}$ is an alkyl group of at least 2 carbon atoms synthesized by reacting a diol-containing polydiorganosiloxane and an aliphatic or aromatic diol with an aromatic or aliphatic dicarboxylic acid chloride to form the alternative block copolyester indicated. A second alternative block copolyester release agent corresponding to the structure:

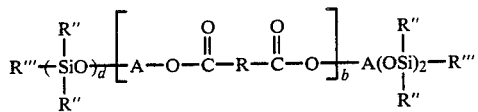

wherein:

R, A, $R^{11}$, b and d are the same as above and
$R^{111}$ is an alkyl group, can be employed. The second alternative is formed by reacting a monohalopolydiorganosiloxane polymer with an aliphatic or aromatic diol and an aromatic or alkyl dicarboxylic acid halide.

Representative block copolyesters which can be employed as release agents include poly[4,4'-isopropylidenediphenylene-co-block-poly-(dimethylsiloxanediyl)sebacate]; poly[1,4-butylene-co-block-poly(-dimethylsiloxanediyl)sebacate]; poly[4,4'-isopropylidenediphylene-co-block-poly(dimethylsiloxanediyl)glutarate; poly(4,4'-isopropylidenediphenylene terephthalate-co-azelate 50/50-bdimethylsiloxane); poly(4,4'-isopropylidene-diphenylene adipate-b-dimethlysiloxane); poly(4,4'-[hexahydro-4,7-methanoinden-5-ylidene]bis(phenylene)carbonate-b-dimethylsiloxane) and poly[1,4-butylene-co-block-poly(dimethylsiloxanediyl)adipate].

The concentration of the release agent can vary to facilitate release of the dielectric support as desired. A useful concentration of release agent is from about 0.05 percent to about 2 percent by weight of the photoconductive layer.

The electrically conducting substrate employed in the above-defined element can comprise any material which is electrically conducting and transmits actinic radiation to which the photoconductive layer is responsive. As noted previously, preferred elements of the invention are sensitive to ultraviolet radiation below 400 nanometers, in which case the electrically conducting substrate should transmit radiation below 400 nanometers. In this manner, the photoconductive layer can be imagewise-exposed to actinic radiation through such substrate to form electrostatic field image patterns on the dielectric support even though the latter contains toner images from previous cycles.

The conducting substrate, furthermore, can either be a single layer of appropriate electrical conductivity and transmissive capability, or it can be multilayer comprising, for example, an electrically conducting layer on a polymeric film. Multilayer substrates are preferred. In such preferred substrates, the polymeric film can comprise any suitable polymer such as cellulose acetate, poly(ethylene terephthalate), polyethylene or polypropylene. The conducting layer on the film, furthermore, can be any well-known transmissive conducting material such as one formed by coating onto the film a solution of a conductive or semiconductive material and a resinous binder in a volatile solvent and evaporating the solvent to leave a conductive layer. Particularly good conductive layers for use with the present elements utilize a metal-containing semiconductor compound such as cuprous iodide, silver iodide, and others as disclosed in U.S. Pat. No. 3,428,451, or metallic salts of a carboxyester lactone of a maleic anhydridevinyl acetate copolymer and others dispersed in a binder. Representative binders include poly(vinylformal), poly(vinyl alcohol), poly(vinyl acetate) and mixtures thereof.

The conductive layer can also contain addenda to improve the uniformity of charge on the proofing element during use. In some instances, when elements are overall charged prior to exposure, the charge so applied is not entirely uniform but instead is mottled. To avoid or minimize such mottle, the conductive layer can also contain certain addenda such as fluorocarbon surfactants. Other addenda which can be incorporated into the conductive layer to minimize mottle include silicones and polyalkylene oxides such as copolymers of polyethylene oxide and polypropylene oxide. The concentration of the mottle-reducing addenda can be in the range from about 0.0002 to about 20 percent, by weight, based on the total weight of the conductive layer.

The conductivity of the defined substrate is generally determined in terms of surface resistivity. The surface resistivity of useful substrates is less than $10^{11}$ ohms per square and is preferably less than $10^5$ ohms per square.

As is well-known to those skilled in the art, many arrangements of photoconductive layers on electrically conducting substrates result in elements bimodal in nature; i.e., they are capable of producing developable electrostatic images when charged either negatively or positively and exposed to actinic radiation. However, in some of these elements, the conducting substrate has a tendency to indiscriminantly inject either positive or negative charge carriers into the photoconductive layer before exposure, preventing operation in either the negative or positive charging mode. In view of such behavior, the present element can also contain a barrier layer between the electrically conducting substrate and the photoconductive layer to prevent unwanted charge carriers from entering the photoconductive layer. Representative barrier layers include cellulose nitrate layers as disclosed in U.S. Pat. No. 3,640,708 and others as disclosed in column 6 of U.S. Pat. No. 3,428,451.

In accordance with a preferred embodiment of the invention, a dielectric support in the form of an overcoat is releasably adhered to the photoconductive layer to form a chargeable surface of the proofing element. Among other things, the toner separation images are overlapped in sequence on the dielectric support and the toner images, together with the support, are transferred from the photoconductive layer to a suitable receiver to form the desired color proof. Because the receiver is usually representative of the print stock upon which the press run will take place, the dielectric support is preferably optically transparent to facilitate viewing of the toner composite image against the receiver, thereby simulating a press run print.

Preferred dielectric supports can be any material capable of retaining an electrostatic charge applied to its surface. In general, any chargeable polymeric material can be employed. Preferably the support is such that with toner formed on its surface as described herein for the color proofing process, forms a barrier to (i.e., prevents) dark injection of charge from such toner into the photoconductive layer. The support preferably also prevents the transmission to its surface of charge carriers photogenerated within the photoconductive layer. If the releasable dielectric support comprises the photoconductive layer, charge injection from the surface thereof to within the layer or from within the layer to the surface can be minimized or avoided through the use of polymers with high glass transition temperatures (Tg) as noted previously in the discussion relative to polymeric binders for use in the photoconductive layer. In this regard, polymers with Tg's from about 100° C. and higher have been found useful to prevent unwanted charge injection. Alternatively, polymers with Tg's below 100° C. can be employed if the Tg of the photoconductor employed is such that the Tg of the polymer and photoconductor in combination is greater than 100° C. When the releasable dielectric support displays such barrier properties, the quality of sequential overlapping separation images is greatly improved.

Representative polymers which can be employed in a preferred dielectric support include polyesters, vinyl polymers, acrylic polymers or cellulosic polymers. For example, such materials as polyvinyl acetate, cellulose acetate butyrate and copolymers of vinylacetate and crotonic acid can be employed. Mixtures of cellulose acetate butyrate with either polyvinyl acetate or with copolymers of vinylacetate and crotonic acid can also be employed.

The thickness of preferred dielectric supports can vary to provide the necessary electrical and optical characteristics to the support. Such dielectric support can have a thickness in the range from about 0.5 to about 5.0 micrometers, preferably a thickness from about 1.5 to about 3.0 micrometers.

Preferred dielectric supports can be applied to the photoconductive layer by any of a variety of ways employed in the art to form overcoated layers. Preferably, the support is applied from a coating solution of the polymeric binder for the support and a coating solvent. To provide coating and layer uniformity, the coating solution can also contain a surfactant such as a silicone fluid, for example, a methylphenyl silicone fluid.

Further advantages can also be obtained when preferred dielectric supports contain an agent to improve ambient stability. Useful stabilizing agents include condensates of ethylene oxide with hydrophobic bases formed by condensing propylene oxide with propylene glycol (polyethylenepolypropylene oxides). These condensates are available commercially as Pluronics from Wyandotte Chemicals Corp., a corporation of Wyandotte, Mich. Employing such condensates appears to provide a degree of hygroscopicity and thereby aids in the electrostatic image-forming process at lower levels of relative humidity. The concentration of the stabilizing agent is from about 0.1 to about 5 percent by weight, based on the total weight of the dielectric support.

FIG. 1 depicts a proofing element 1 in accordance with a preferred embodiment of the invention. Element 1 comprises a dielectric support 2 releasably adhered to a photoconductive layer 3 to form a chargeable surface of element 1. Photoconductive layer 3, in turn, overlies a transparent, electrically conductive substrate 4 which in the embodiment shown comprises an electrically conducting layer 5 on a film support 6. Optionally (not shown), element 1 can contain a barrier layer between the photoconductive layer 3 and the electrically conductive substrate 4 to facilitate bimodality as described elsewhere herein.

Figure 2:
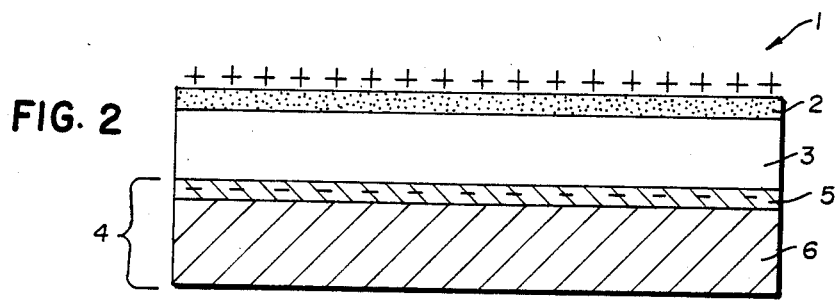
FIGS. 2 through 4 illustrate that part of the invention in which a first toner separation image is electrophotographically formed on the proofing element of the invention.
Figure 3:
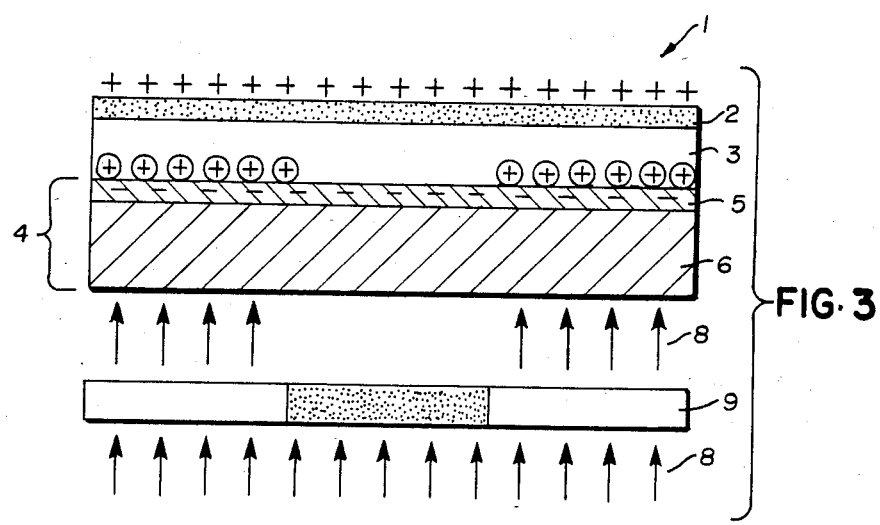
Figure 4:
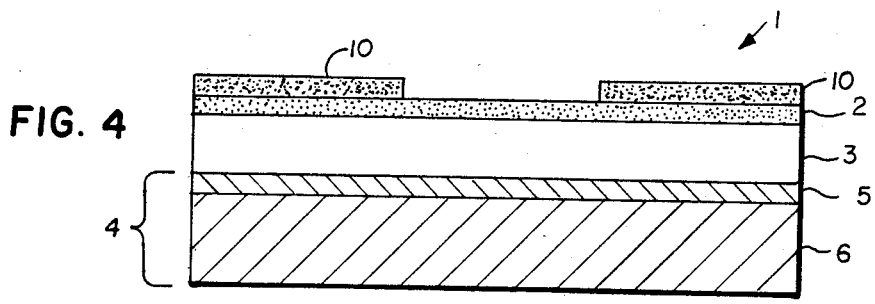

FIGS. 2 through 4 show the formation of the first toner separation image on the surface of the dielectric support. Initially (FIG. 2), the dielectric support 2 is overall-charged with an appropriate charging means such as a corona charger (not shown) to form a uniform potential on the surface of the dielectric support 2. Upon being so charged, in this case positively, a balancing negative charge forms uniformly in the conductive layer 5 as shown. When the photoconductive layer 3 is imagewise-exposed through the conductive substrate 4 to actinic radiation 8 transmitted by overall exposure of a color separation transparency 9 as shown in FIG. 3, mobile charge carriers, in this case positively charged holes, are formed in photoconductive layer 3 and migrate toward the interface of photoconductive layer 3 and conducting layer 5. (Nonmobile charge carriers, electrons, remain randomly distributed throughout the photoconductive layer.) Accordingly, the electric-field strength in exposed regions is diminished while the field strength in unexposed regions remains approximately the same. As a result, an electrostatic differential pattern is formed on the dielectric support 2 corresponding to the pattern on the transparency. When the electrostatic differential pattern is contacted with a positively charged electrographic developer composition, positively charged toner particles adhere to exposed regions exhibiting higher field strengths and thus form the first toner separation image 10 as shown in FIG. 4. A development electrode (not shown) can also be employed in the development zone above dielectric support 2. The development electrode is usually charged to the same polarity and potential as the unexposed regions of the dielectric support to enhance the development efficiency in large solid areas in accordance with known procedures. In these illustrations, the first toner separation image 10 is a negative sense image in which image optical density corresponds inversely to optical density in the separation transparency. (It will be appreciated by those skilled in the art, however, that toner particles can be directed to unexposed regions where the surface potential is greater by using, in the case illustrated, negatively charged developers.) After developing the first charge pattern, the toner separation image 10 can be fixed by pressure, by heat, by solvent treatment or through the use of self-fixing developer formulations as disclosed, for example, in copending U.S. Pat. application serial No. 390,487 entitled SELF-FIXING LIQUID ELECTROGRAPHIC DEVELOPERS CONTAINING POLYESTER TONERS AND DISPERSED WAX AND PROCESSES FOR USING THE SAME, and filed June 21, 1982, in the name of D. Santilli.

Figure 5:
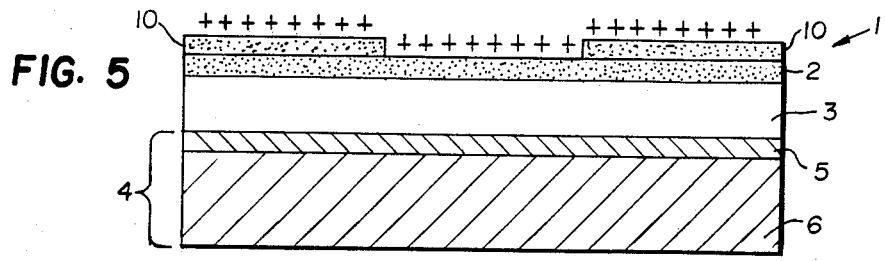
FIGS. 5 through 7 illustrate that part of the invention in which a second toner separation image is electrophotographically formed over the first toner separation image on the proofing element of the invention.
Figure 6:
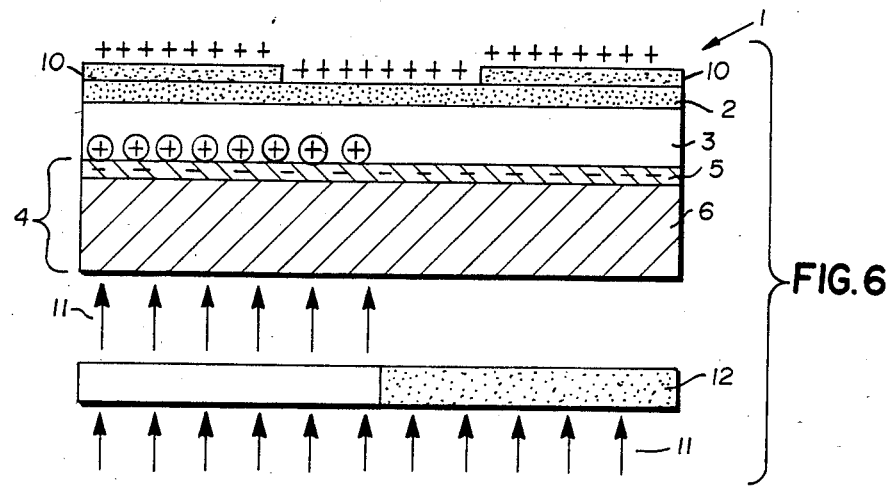
Figure 7:
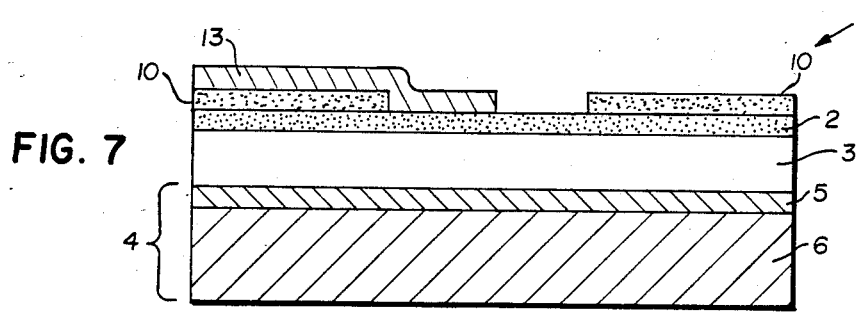

FIGS. 5 through 7 depict the formation of the second toner separation image on the dielectric support overlapping the first toner image. Although the figures do not show it, any residual charge remaining on element 1 after forming the first toner image can be erased by overall exposure to actinic radiation. Thereafter, element 1 is again charged positively as shown in FIG. 5 to form a uniform potential on both toned and untoned images. Imagewise exposure of the photoconductive layer 3 through conductive substrate 4 as shown in FIG. 6 to actinic radiation 11 transmitted by a second color separation transparency 12 (which is different from color separation transparency 9 shown in FIG. 3) produces a second differential charge pattern in the same manner as discussed above. Development with a second developer composition, also charged positively, results in a second toner separation image 13 partially overlapping the first toner separation image 10 as shown in FIG. 7.

Figure 8:
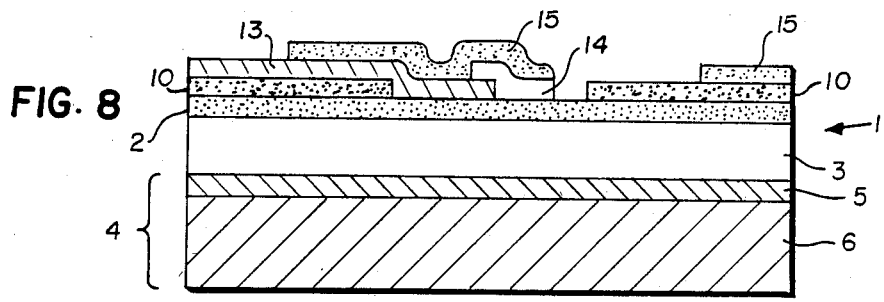
FIG. 8 illustrates a proofing element of the invention upon which four toner separation images have been sequentially formed in accordance with the method of the invention.

In the formation of a multicolor proof, the above charge-expose-develop steps can be repeated at least two more times to form a four-color image as shown in FIG. 8 wherein third (14) and fourth (15) toner separation images overlap first (10) and second (13) toner separation images. When the color of these toners is respectively black, cyan, magenta and yellow for each separation image, a full color composite image results on dielectric support 2 corresponding to the composite image desired in a press run.

Figure 9:
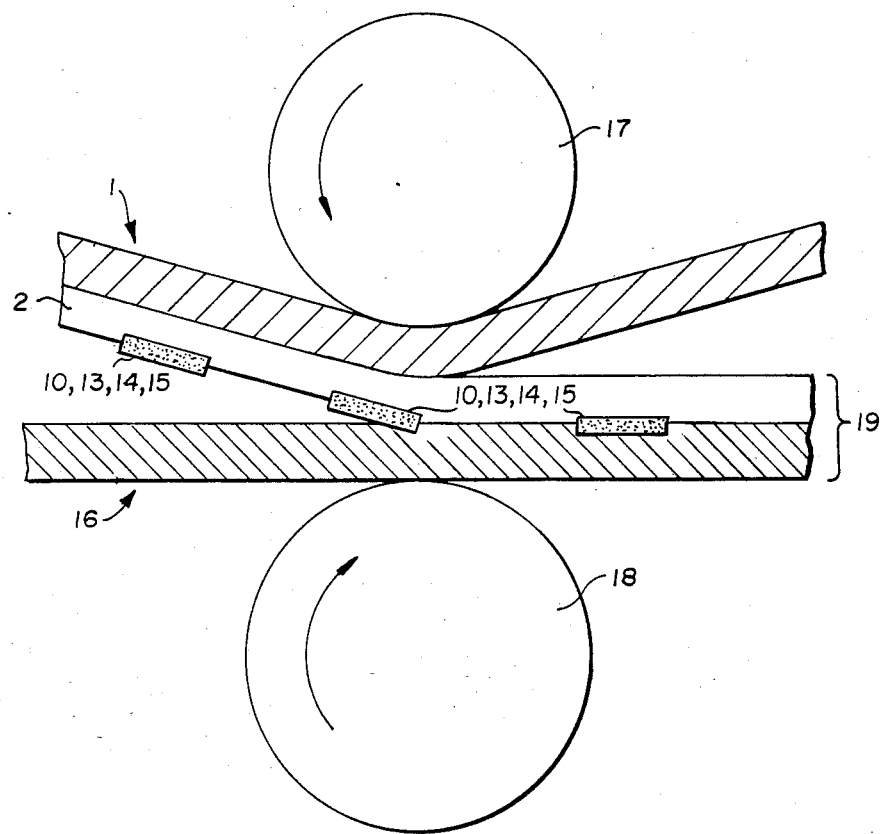
FIG. 9 illustrates thermal transfer of the dielectric support and a composite toner image of four toner color separation images to a receiver to form a color proof in accordance with the final step of the invention.

After formation of the desired number of separation images, the dielectric support and the images thereon are brought into contact with a receiver element and transferred from the proofing element to the receiver to form the desired multicolor proof. FIG. 9 depicts such transfer wherein dielectric support 2 on element 1 is brought into contact with a receiver element 16 in a nip formed between rollers 17 and 18. By the application of sufficient pressure and heat within the nip, dielectric support 2 and the composite of images 10, 13, 14 and 15 become laminated to the receiver 16 as shown to form a color proof 19. Alternatively (not shown), the dielectric support carrying the toner images can be brought into planar contact—as opposed to rolling contact—with the receiver element where lamination is effected again by heat and pressure provided, for example, by a platen supporting either the receiver or the proofing element. Thereafter, the photoconductive layer 3 can be stripped from the dielectric support to complete the transfer of the support and composite image to the receiver, forming thereby the desired color proof comprising, in sequence, the receiver, the composite image and the dielectric support.

In the lamination and subsequent transfer of the dielectric support and composite image, a temperature above the Tg of the polymeric material in the dielectric support is chosen so as to soften and tackify the support. The dielectric support, moreover, is chosen from among materials adhering preferentially to the receiver, thereby facilitating transfer of the support and composite image to the receiver. Representative temperatures employed during the transfer step extend from about 100° to about 115° C.; however, the system can operate over a wider temperature range depending on the choice of materials. Practical considerations in selecting the upper temperature point include the liklihood that either the receiver or the proofing element will distort at the temperature selected, as well as the propensity of components in the photoconductive layer to oxidize at the temperature chosen which would tend to impart undesirable background coloration to the final proof if any of these components transfer to the receiver. The lower limit of the temperature employed to effectuate transfer, moreover, is governed to a large extent by the permanency of adhesion of the support and composite image to the receiver. If the support and image are easily removed from the receiver, the transfer temperature can be increased to enhance the permanency of such adhesion.

Pressures employed to transfer the support and composite image to the receiver can also vary widely. Planar transfers (i.e., transfers effected while the dielectric support and receiver are in full planar contact) have been successful using relatively low pressures from about 30 to about 40 pounds per square inch (from about 0.207 to about 0.276 megapascals, MPa). Optimum transfers have been effected with a pressure of about 35 psi (about 0.276 MPa); however, departures from such pressures are appropriate depending, for example, on the roughness of the receiver surface. Preferably, the receiver surface should be smooth as rough surfaces tend to inhibit transfer of the support and composite image.

The receiver element to which the dielectric support and composite toner image are transferred can be any suitable material against or through which the toner image can be viewed. As noted earlier, the receiver is preferably print stock such as paper upon which the press run will be conducted. The receiver can also be of transparent material such as a polymeric film. With respect to the latter, the present invention also contemplates, as an embodiment, transfer of the composite toner image and dielectric support to image-bearing elements such as microfilm or microfiche so that the composite color image forms information in addition to image information already present on such image-bearing elements. In addition, the invention contemplates the use of nonbirefringent translucent polymeric materials such as cellulose esters for use as the receiver. Receivers manufactured from such materials are suited for use in forming three-color filter arrays by the process described herein involving the formation of filter array matrices of the complementary colorants cyan, magenta and yellow in the respective color toner separation steps. If desirable, the receiver can also contain a suitable overcoat layer adapted to soften under the influence of pressure and heat during the transfer step. In this manner, the adhesion of the dielectric support and composite toner image to the receiver can be enhanced.

The following preparations and examples are provided to aid in the practice and understanding of the invention

EXAMPLE 1

Electrophotographic proofing elements of the invention

An electrophotographic element comprising, in sequence, a photoconductive layer, a barrier layer, an electrically conducting layer and a film support were employed. A dielectric support was releasably adhered to the photoconductive layer. The photoconductive layer contained:

(a) as an electrically insulating binder, a blend of two polyesters containing 94%, based on the total weight of binder, of a terpolymer of terephthalic acid, 2,2-bis[4($\beta$-hydroxyethoxy)phenyl]propane and ethylene glycol;

and about 6%, based on the total weight of binder, of a copolymer of terephthalic acid, ethylene glycol and neopentyl glycol;

(b) 22.5%, based on the total weight of the layer, of equal parts by weight of three photoconductive compounds. The three compounds were 4,4'-bis(diethylamino)-2,2'-dimethyltriphenylmethane, 1,1-bis(4-N,N-diethylamino-2-methylphenyl)-2-methylpropane, and bis(4-N,N-diethylamino-2-methylphenyl)-4-methylphenylmethane;

(c) 2%, by weight of the layer, of the sensitizer N,N-bis[p-(n-butyl)phenyl]-1,4,5,8-naphthalenebisdicarboximide; and (d) 0.25%, by weight of the layer, of the siloxane-release agent poly(Bisphenol A)adipate-poly(dimethylsiloxane) to facilitate thermal release of the dielectric support.

The barrier layer was optically transparent and comprised cellulose nitrate.

The electrically conducting layer was optically transparent and comprised (a) cuprous iodide in a binder containing poly(vinyl formal) with 5–7 weight percent, based on binder, poly(vinyl alcohol) and 40–50 weight percent poly(vinyl acetate) to provide a surface resistivity of $1 \times 10^4$ ohms/square, and (b) 0.26 weight percent, based on the weight of the layer, of Fluorad FC-431 TM surfactant (a 3M Company tradename for a fluorocarbon surfactant described as a short-chain oligomeric ester wherein the ester group is fluorinated).

The support comprised an optically transparent, 4.7 mil (0.12 cm) thick polyethylene terephthalate film subbed to provide adhesion with the electrically conducting layer.

The dielectric support on the photoconductive layer comprised a blend of poly(vinylacetate-co-crotonic acid, 95/5 mole ratio) and cellulose acetate butyrate in a ratio by weight of 80:20. Several elements were formed with dielectric supports having uniform thicknesses of 0.5, 1.6 or 2.4 micrometers on each respective element.

EXAMPLE 2

Multicolor proofing method

The element described in Example 1 having a 2.4-micrometer thick dielectric support was employed in a color proofing process. A color separation negative was mounted on a vacuum platen composed of quartz glass for transparency. The color proofing element was placed in register over the separation negative with the dielectric support surface facing away and the transparent polymeric film facing against the negative. To form the first toner separation image on the dielectric support, the latter was overall-charged to +600 volts. Thereafter, the photoconductive layer was imagewise-exposed through the platen, separation negative, transparent film support and conducting layer to form a latent electrostatic image on the dielectric support. The latent image was developed with a self-fixing liquid electrographic developer containing black-pigmented toner particles in an electrically insulating carrier liquid, followed by a vacuum drying step and a rinse in clear carrier liquid. The developed image on the dielectric support was then fused by drying in air. The procedure was repeated three times with cyan-, magenta- and yellow-colored self-fixing developers, respectively, to form a composite multicolor toner image on the dielectric support.

The proofing element bearing the multicolor toner image was then moved to a separate lamination device comprising heated metal and rubber rolls, together forming a nip. The toner image was passed through the nip with and against a receiver paper at a roll temperature of 100° C. (212° )and a pressure of 225 pounds per square inch (1.551 MPa) to effect transfer of the dielectric support and composite image to the receiver. The resulting multicolor proof presented a multicolor toner image against a paper white background, thus accurately resembling a multicolor print from a full press run.

The black toner employed in the developer composition comprised, as binder, the polyester poly[neopentyl-4-methylcyclohexene-1,2-dicarboxylatecoterephthalate-co-5-(N-potassio-p-toluenesulfonamidosulfonyl-)isophthalate)]; as colorant, carbon black and alkali blue dye; wax and dispersing agent for the wax, with the ratio of the weight of the wax plus dispersing agent for wax to the weight of binder being at least 0.25. In the cyan, magenta and yellow toners, the black colorants were replaced with Sunfast Blue NF (Sun Chemical Co.), Bonadur Red (Sun Chemical Co.) and Ragoon Yellow (Sun Chemical Co.), respectively.

EXAMPLE 3

Proofing element with releasable photoconductive layer

An element as described in Example 1 is prepared omitting the overcoat as the releasable dielectric support. Suitable addenda are incorporated into the photoconductive layer to promote its releasability from the electrically conducting substrate. Preferably, the binder polymer employed in the photoconductive layer is selected from among relatively high Tg materials to provide a barrier to dark charge injection and unwanted injection of photogenerated charge carriers.

Similar results can be expected when this element is employed in the method described in Example 2.

Although the invention has been described in considerable detail with particular reference to certain preferred embodiments thereof, variation and modifications can be effected within the spirit and scope of the invention.

What is claimed is:

1. A color proofing method comprising:
(I) forming a first color separation image on the dielectric support of an electrophotographic proofing element comprising,
   (a) a photoconductive layer on an electrically conductive substrate capable of transmitting actinic radiation to which the photoconductive layer is responsive, and
   (b) a releasable dielectric support comprising the photoconductive layer or an overcoat thereof, forming a surface of the element capable of holding an applied electrostatic charge, by
      (i) overall charging the surface of the dielectric support,
      (ii) imagewise-exposing the photoconductive layer to actinic radiation to form a first electrostatic image on the surface of the dielectric support,
      (iii) developing the first electrostatic image with a first color developer composition to form the first color separation image, (II) forming a second color separation image over the first color separation image on the surface of the dielectric support by
    (iv) overall charging the surface of the dielectric support and first color separation image,
    (v) while the dielectric support and first color separation image are still charged, imagewise-exposing the photoconductive layer to actinic radiation through the substrate to form a second electrostatic image, and
    (vi) developing the second electrostatic image with a second color developer composition to form the second color separation image, and (III) contacting the surface of the dielectric support having said color separation images thereon with a receiving element, and (IV) transferring the dielectric support and color separation images to the receiving element to form a multicolor proof.

2. A color proofing method as described in claim 1 wherein said dielectric support comprises an overcoat releasably adhered to said photoconductive layer.

3. A color proofing method as described in claim 1 or 2 wherein, prior to step (III), steps (II)-iv through (II)-vi are repeated to form third and fourth color separation images, thereby forming a composite of four overlapping toner separation images on said dielectric support.

4. A color proofing method as described in claim 3 wherein said first, second, third and fourth color separation images are black, cyan, magenta and yellow separation images, respectively.

5. A color proofing method as described in claim 1 or 2 wherein said receiving element comprises a paper sheet.

6. A color proofing method as described in claim 1 or 2 wherein the developer composition employed in the formation of each separation image is a liquid electrographic developer comprising an electrically insulating carrier liquid and toner colorant particles dispersed in said liquid.

7. A color proofing method as described in claim 2 wherein said dielectric support is transparent.

8. A color proofing method as described in claim 2 wherein said photoconductive layer contains a release agent to enhance the releasability of said dielectric support from said photoconductive layer.

9. A color proofing method as described in claim 8 wherein said release agent comprises a block copolyester containing polysiloxane recurring units.

10. A color proofing method as described in claim 1 or 2 wherein said photoconductive layer is sensitive to actinic radiation below 400 nm only and exhibits non-persistent conductivity.

11. A color proofing method as described in claim 10 wherein said photoconductive layer comprises an arylalkane leuco base photoconductor.

* * * * *